United States Patent [19]

Tabei

[11] 4,404,586
[45] Sep. 13, 1983

[54] SOLID-STATE COLOR IMAGER WITH STRIPE OR MOSAIC FILTERS

[75] Inventor: Masatoshi Tabei, Sunnyvale, Calif.

[73] Assignee: Fuji Photo Film Co., Ltd., Kanagawa, Japan

[21] Appl. No.: 330,927

[22] Filed: Dec. 15, 1981

[51] Int. Cl.³ .............................................. H04N 9/07
[52] U.S. Cl. ........................................ 358/44; 358/43
[58] Field of Search ...................... 358/41, 43, 44, 46, 358/47, 48; 250/211 J

[56] References Cited

U.S. PATENT DOCUMENTS

| | | | |
|---|---|---|---|
| 3,617,753 | 11/1971 | Kato | 358/44 |
| 3,971,065 | 7/1976 | Bayer | 358/41 |
| 3,984,721 | 10/1976 | Sato | 358/46 |
| 4,047,203 | 9/1977 | Dillon | 358/44 |
| 4,214,264 | 7/1980 | Hayward | 358/44 |
| 4,315,279 | 2/1982 | Kuwayama | 358/44 |

*Primary Examiner*—Tommy P. Chin
*Attorney, Agent, or Firm*—Sughrue, Mion, Zinn, Macpeak & Seas

[57] ABSTRACT

A solid-state color imager comprised of a solid-state base comprised of a plurality of charge switching elements said base further including photodiode elements associated with some of the switching elements arranged in sets having superimposed thereon a photosensor layer comprised of photoconductor segments which can detect and absorb light. A plurality of mono colored stripe filters are superimposed over the photosensitive layer. The photosensitive layer is comprised of an upper transparent continuous electrode sublayer, a photoconductive sublayer, and a back mosaic transparent electrode sublayer which is electrically connected to said base. When light strikes the filter stripes, light of a particular color is absorbed. The unabsorbed light continues to travel and strike the photosensor layer whereat another color of light is absorbed and detected. The unabsorbed light passing through the photosensor layer and perhaps a stripe filter, strikes the photodiode elements of the base which detect the remaining light. The photosensor layer is electrically insulated from the base and in connection with the photodiode elements of the base and filter stripes, make possible detection of three separate colors of light such as blue, green and red without the use of multi-color filter arrays.

9 Claims, 8 Drawing Figures

SOLID-STATE COLOR IMAGER WITH STRIPE OR MOSAIC FILTERS

RELATED APPLICATIONS

This application is related to my two co-pending applications entitled "Solid-State Color Imager with Three Layer Four Story Structure" and "Solid-State Color Imager with Two Layer Three Story Structure", filed concurrently with this application.

FIELD OF THE INVENTION

The invention relates to solid-state color image sensors, and more particularly to a solid-state color image sensor which utilizes a photosensor layer and stripe or mosaic filters superimposed over a solid-state base which includes photosensors, making it possible to eliminate the need for multi-color filters.

BACKGROUND OF THE INVENTION

A well-recognized goal within the field of solid-state color image sensors is the production of a solid-state color imager which is highly sensitive to light, and which produces a clear image while being inexpensive to manufacture. In pursuit of this goal, a number of different types of solid-state color imagers have been produced.

In one such imager, panchromatic image sensing elements in an array are selectively sensitized to color by means of an integral array of color filters disposed over the array of image sensing elements such as photodiodes associated with MOS elements on a base. Highly efficient configurations for such filter arrays maximize the amount of usable information based on human visual acuity for color detail and have been described for example in U.S. Pat. No. 3,971,065 issued July 20, 1976 to Bayer and U.S. Pat. No. 4,047,203 issued Sept. 6, 1977 to Dillon. However, the resolution capabilities inherent within such arrays are limited by the number of sensing elements that can be placed on the array and are further limited in that only a portion of each element in the array contributes to the resolution of fine detail. Consequently, the spatial resolution of such integral-filter color image sensing arrays, while optimized for the particular design, will not be as high as monochrome image sensing arrays of the same number of elements.

Another structure as proposed within British Pat. No. 2,029,642 and Japanese Patent Application Laid Open (OPI) Nos. 55-39404; 55-277772; 55-277773; and 51-95720 is constructed such that a photosensor layer is superimposed on top of the information transfer device or solid-state base which is capable of a switching function. The base may be an MOS or CCD switching device. Such devices are described in detail within United Kingdom Pat. No. 2,029,642 the disclosure of which is incorporated herein by reference. Such structures have potentially high sensitivity due to a larger sensing area than is present within conventional imaging devices where the photosensor is located on the same level as the information transfer device. However, such devices must utilize multi-color filters and the loss of resolution is comparable to normal solid-state imagers as discussed above. In addition, to produce such a structure, the color filters must be arranged in a particular pattern on the image sensing element which creates difficulty in the alignment and bonding of the filters making the production of such devices complex and expensive.

Technique for eliminating color filters in a vidicon is taught in U.S. Pat. No. 3,617,753 of Kato et al. The vidicon includes a conventional semiconductor layer having a substrate on a plurality of p-n diodes which store electrical signals representing light intensity. An electron beam scans the p-n diodes to provide video read out. By stepping the thickness of the semiconductor substrate through which the light passes to the p-n diodes, different wavelength light impinges on the p-n diodes, depending on the size of the step. In this manner different groups of p-n diodes can store different color light. Alternatively the p-n diodes can be formed at varying depths from the surface, thereby effectively stepping the thickness of the substrate. In another embodiment, solid state scanning can be provided instead of electron beam scanning. There a junction device and a MOS element is provided at each pixel and selective etching of the substrate results in varying distances between the light receiving surface of the semiconductor substrate and the junction device of the pixel. The apparatus disclosed is not planar due to the stepped or cutout arrangement and does not have the advantage provided by systems using photoconductors as the light responsive element.

A solid-state color image sensing array has been developed wherein the potential resolution is equal to that of a monochrome array of the same size. Such a sensing array has a plurality of superimposed channels (e.g., three superimposed channels for a three-color device) wherein each channel has a different spectral response due to differential absorption of light by a semiconductor material. (See Research Disclosure, August 1978, Vol. 172, Disclosure No. 17240 entitled: "Color Responsive CCD Imager" available from Industrial Opportunities, Ltd., Honeywell, Havant, Hampshire P091EF, U.K.) However, extremely complex and expensive processes are necessary to produce such devices due to the necessity of superimposing the three channels. When utilizing the CCD (charge-coupled device), the channels which carry the information signal must be carefully constructed within precise limitations making the construction complicated and expensive. Although it is possible to produce a single channel on a substrate, it is complicated and difficult to superimpose additional channels thereon.

Devices such as those descirbed in Disclosure No. 17240 indicate that it is possible to produce multiple superimposed varied channels in silicon crystal which can act as multi-channel superimposed color-sensing devices. However, in addition to the expense and complication of their manufacture, as mentioned above, the color separation and selectivity of these devices is poor due to the inherent limitations of the materials used. The materials used in making such devices act as CCD channels which must have good single crystalline properties as well as color selective photosensors.

As mentioned above, there exists a need within the field for a solid-state color imager which is highly sensitive to light and which gives sharp, detailed resolution of the image. By utilizing a device wherein the multicolored filters are superimposed over the image-sensing elements in an array, the resulting image, as described within U.S. Pat. No. 3,971,065, has limited resolution capabilities, limited sensitivity and is complicated and expensive to produce due to the necessity of precisely placing the multi-color filters. Increased sensitivity can be obtained by utilizing a device wherein a photosensor is superimposed on top of the information transfer device, as described within United Kingdom Pat. No. 2,029,642. However, resolution of such devices is still somewhat limited because they require the use of multicolor integral filters which also increases the complexity and expense of their production. By utilizing a device having a sensing array of a plurality of superimposed channels, it is possible to obtain a resolution equal to that of a monochrome array. However, complex, expensive manufacturing techniques must be utilized to superimpose three channels on top of each other.

The present invention utilizes a photosensitive layer and stripe or mosaic filters which are superimposed on each other and over the base which includes an array of photodiode elements which are used for detecting a single color of light. The invention eliminates the need for multi-color integral filters since the photosensitive layer and the elements on the base in combination with the stripe or mosaic filters, make it possible to detect and electrically separate different colors of light.

SUMMARY OF THE INVENTION

The present invention provides a solid-state color imager which can be produced using simple, inexpensive conventional techniques such as conventional vacuum deposition or sputtering techniques. The device is highly sensitive to light and produces an image having a desirably high resolution considering the characteristics of the human eye.

The invention is comprised of a solid-state base for handling electrical charges with photosensing elements in the form of photodiodes also on the base. A photosensor layer is superimposed on the base for absorbing and detecting light. The photosensor layer may be in the form of a single layer or a plurality of stripes or a mosaic. Stripe or mosaic filters are superimposed over the photosensor layer. The solid-state base may be any type of two-dimensional information device such as a charge couple device (CCD) or metal oxide semiconductor matrix switching device (MOS). The base carries out switching and transfer functions in connection with the photosensitive layers and the photosensing elements of the base itself. The photosensor layer superimposed on the base is comprised of three sublayers including an upper continuous transparent electrode layer, a mosaic pattern of back transparent electrodes with a photosensitive sublayer positioned therebetween. The back electrodes on the layer are electrically connected with the solid-state base, as are the photosensing elements on the base, e.g., source or drain terminals of an MOS, CCD, or other switching device. The photosensor layer is electrically insulated from the solid-state base at all points other than via the electrical connections.

It is a primary object of this invention to present a solid-state color imager comprised of a solid-state base which includes photosensitive elements and has a photosensor layer superimposed thereon with stripe or mosaic filters thereon so as to filter light from a first set of elements on the base such that the layer and first and second sets of photosensing elements of the base or first and second sets within the layer and photosensing elements, by electrical subtractive method make it possible to read out electrical charges corresponding to three color bands.

Another object of the invention is to present a solid-state color imager which can be produced without the need of multicolor filters.

Still another object of the invention is to present a solid-state color imager which is highly sensitive to light.

Yet another object of this invention is to present a solid-state color imager which can produce an image with high resolution.

Another object of this invention is to present a solid-state color imager which can be produced in a simple and inexpensive manner.

These and other objects and advantages of the present invention will become apparent to those skilled in the art upon reading the details of construction and usage as more fully set forth below, reference being made to the accompanying drawings forming a part hereof wherein like numerals refer to like parts throughout.

DESCRIPTION OF THE PREFERRED EMBODIMENTS

Before the present solid-state color imager is described, it is to be understood that this invention is not limited to the particular arrangement of components shown, as such devices may vary. It is also to be understood that the terminology used herein is for purposes of describing particular embodiments, and is not intended to be limiting.

Figure 1:
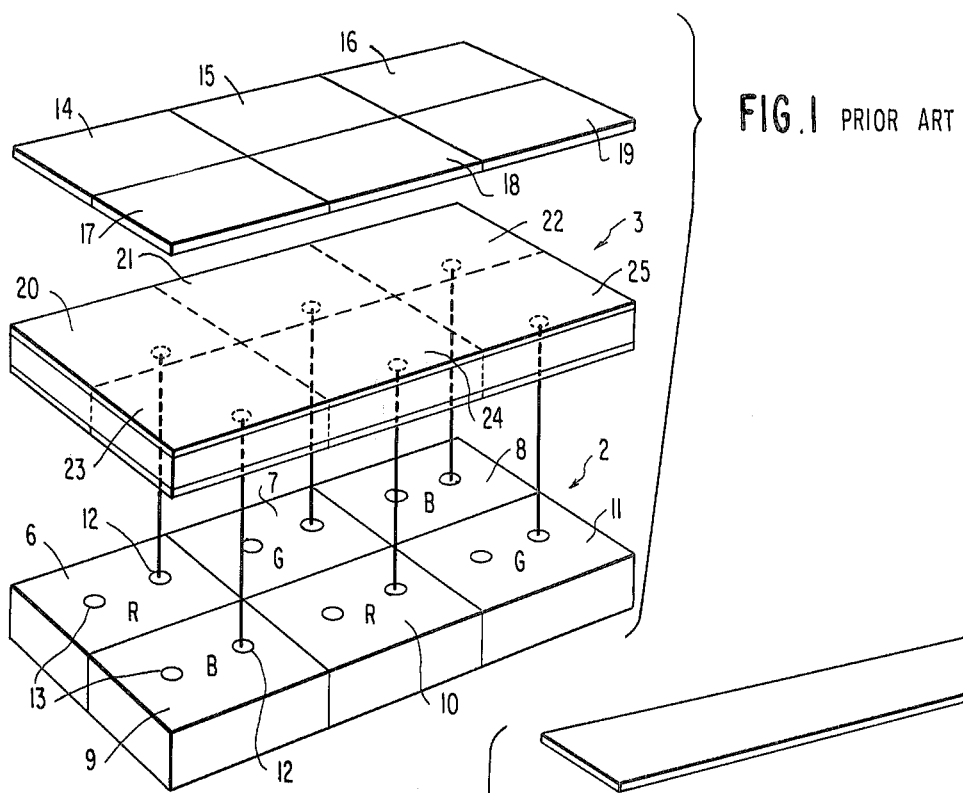
FIG. 1 is an exploded perspective view of a conventional solid-state color imager showing a photoconductive layer superimposed on a base.

Referring now to FIG. 1, a conventional solid-state color imager, of the type having a photosensitive element superimposed on the base can be described. FIG. 1 is an exploded perspective view of a conventional solid-state color imager. The base 2 has a photosensitive layer 3 superimposed thereon. The base 2 includes a plurality of MOS switching elements 6, 7, 8, 9, 10 and 11. FIG. 1 shows only a portion of what such an imager includes. In reality, the imager includes thousands of MOS elements. The elements 6, 7, 8, 9, 10 and 11 are utilized for various switching and transfer functions in connection with, for example, red, green, blue, blue, red and green light, respectively. Each of the elements 6-11 includes a source terminal 12 and a drain terminal 13.

The photosensitive layer 3 is comprised of three sublayers which are described further below. The bottom sublayer or back mosaic electrodes on the bottom or innermost sublayer of the layer 3 are all electrically connected to elements 6-11. Superimposed over the photosensitive layer 3 are filter elements 14, 15, 16, 17, 18 and 19 which correspond respectively to elements 6, 7, 8, 9, 10 and 11. The filter elements 14-19 are utilized to filter out all light except a single color of light. Accordingly, for example, the filter 14 is utilized to filter out all light except red light; the filter 15 filters out all light except green light; and the filter 16 filters out all light except blue light, etc., in correspondence with the switching and transfer functions of elements 6-11 mentioned above.

Since the photosensing function within the layer 3 is separated from the switching and transfer function within the base 2, the device as shown within FIG. 1 is significantly more sensitive to light than prior art devices wherein the photosensing function was carried out at the same level as the switching and transfer functions. However, the device as shown within FIG. 1 still requires the use of the multi-color filters 14-19 and such filters require precise placement making the construction of the device somewhat expensive. The filters 14-19 are utilized to filter out light before it reaches the photosensitive areas 20, 21, 22, 23, 24 and 25 which are defined by their respective back electrodes.

The combination of each MOS elements 6-11, photosensitive area 20-25 and filter 14-19 forms what are referred to in the art as pixels. Accordingly, the portion of the device as shown within FIG. 1 shows six pixels.

Applicant's invention is capable of producing a device utilizing the same size base 2 which includes six pixels, or what is described below as two pixel sets, while eliminating the need for the multi-color filters.

Figure 2:
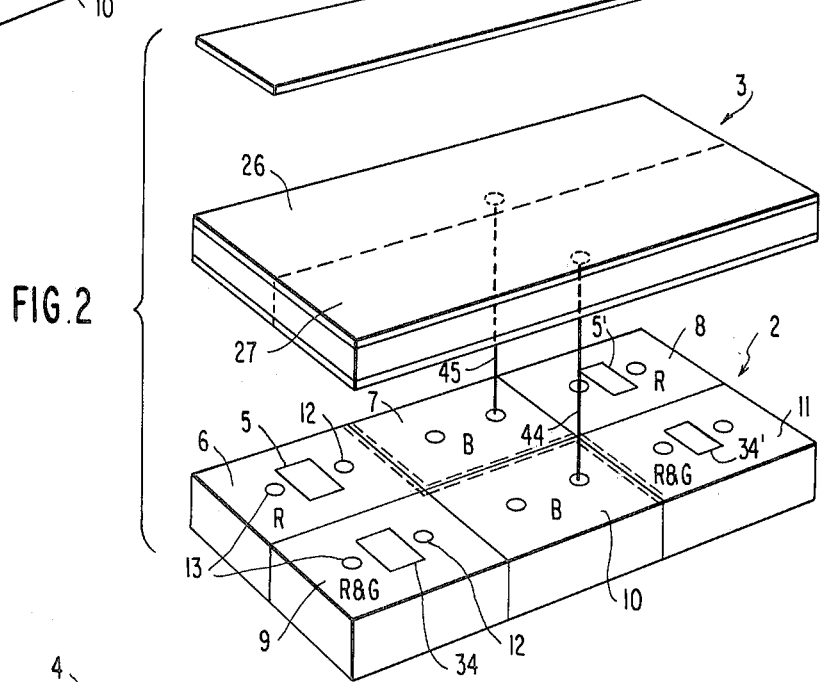
FIG. 2 is an exploded perspective view of the solid-state color imager of the present invention.

Referring now to FIG. 2, wherein an exploded perspective view of the present invention is shown. The imager includes a base 2 having MOS elements 6, 7, 8, 9, 10 and 11 positioned thereon. Photosensitive layer 3 and stripe filters 4 are superimposed on the base 2. The layer 3 is comprised of sublayers which are described in more detail with reference to FIG. 3. FIG. 2, like FIG. 1, shows only a small portion of the imager which is made up of thousands of similar portions.

The layer 3 includes photosensitive elements 26 and 27. The elements 26 and 27 are each connected to one of the MOS elements of the base 2. Although it is easier to understand the present invention if the layer 3 is described as consisting of photosensitive elements 26 and 27, it should be understood the top electrode sublayer and the photoconductive sublayer may be, and preferably are, continuous layers. The bottom mosaic electrode sublayer is not continuous and it defines the metes and bounds of each photosensitive element.

The elements 26 and 27 are connected respectively to MOS elements 7 and 10. The combination of MOS element 10 and photosensitive element 27 with photodiodes 5 and 34 as well as the associated MOS elements 6 and 9, comprise what is referred to as a pixel set and two pixel sets are shown FIG. 2. Photosensitive elements 5 and 5′ are associated with MOS elements 6 and 8. Photosensitive elements 34 and 34′ are associated with MOS elements 9 and 11. The elements 5, 5′ and 34, 34′ are all sensitive to all wavelengths of light but elements 5 and 5′ detect different light than elements 34 and 34′ because elements 5 and 5′ are located beneath the stripe filter 4 which blocks some light.

As will be appreciated, each region 6-11 consists of a switching element (MOS in the example) and in some cases also a photodiode. These elements are only designated generally in the drawings as their structure and composition is well known. Also as is well known, each switching element, representing a single pixel, switches a signal representing light intensity of a particular color. In the present invention the "color" of the signal depends upon the position of the stripe filter 4 and whether the photosensitive layer 3 or a photodiode is used as the photo sensing element for the pixel.

As an example, assume filter 4 is a magenta filter, i.e., it absorbs green light; layer 3 is a CdS photoconductor, i.e., it absorbs and is sensitive to blue light. Consider first region 6. The light impinging thereon will have first passed through filter 4 and layer 3. Thus, only red light will strike photodiode 5 and the signal switched by the MOS will represent the intensity of red light in an area defined by the photodiode. The same is true for region 8. The light striking photodiodes 34 and 34′ will have first passed through layer 3, but not filter 4. Thus the signal switched by MOS elements in regions 9 and 11 represent the Red and Green light intensities of the light impinging thereon. Regions 7 and 10 operate exactly as the pixels in FIG. 1 except that their respective areas of photosensing is shown as being larger than the corresponding size of the regions. Photoconductor layer 26 responds to blue light and delivers a signal representing blue intensity to the MOS in region 7. The same is true for photoconductor 27 and region 10. In this particular instance, filter 4 has no effect because layers 26 and 27 respond to blue only and the filtering of green light will not change that effect.

The basic concept of the invention is shown in FIG. 2, but detals vary depending upon the filter and photoconductor materials selected and the physical arrangement of pixels in each set. For example the three pixels in a pixel set are in an L-shaped geometry in FIG. 2, but they can be linearly arranged. Also, there can be more than three pixels in a pixel set. In a simple case, a fourth pixel may include a photodiode and be positioned so that light impinging thereon does not pass thru either filter 4 or photoconductor 3. That fourth pixel would thus develop a signal representing the white light intensity. As is well known, video signals representing the primary colors can be derived by known circuit techniques from the color signals developed by the pixels of FIG. 2 and by those of the other examples given herein.

The possible combinations are numerous and depend upon the filter and photoconductor selected. Several combinations are given below.

EXAMPLE 1

With a magenta filter and a CdS photoconductor, pixels developing signals representing red, red plus green, blue, and white light are possible. The "white" pixel includes a photodiode and receives incident light directly. The "red" pixel includes a photodiode and receives red light after the green and blue have been filtered out by the filter and the photoconductor, respectively. The "red and green" pixel included a photodiode and receives red and green light after the blue has been filtered out by the photoconductor. The "blue" pixel does not include a photodiode, but the switching element (MOS) is electrically connected to the photoconductor which effectively delivers a "blue" intensity signal to the pixel. This example, except for the "white" pixel, is FIG. 2. If a fourth, "white" pixel, is included, the photoconductor layer 3 would have to be discontinuous to permit light, unfiltered by layers 3 or 4, to impinge on the "white" pixel.

EXAMPLE 2

This is the same as Example 1 except for substitution of a cyan filter for a magenta filter. The former absorbs red light. The four resulting pixels would be, white, green, blue, and red plus green.

EXAMPLE 3

In this example a magenta filter and a GaAsP photoconductor are used. The former filters out green light. The latter absorbs and is sensitive to blue plus green. The resulting pixels are "white," "red," "blue," and "blue plus green." In this example, two pixels of the pixel set are electrically connected to the photoconductor layer. Thus the bottom electrode of the layer must be segmented to isolate regions on the photoconductor to connect respectively to the MOS elements of the "blue" and "blue plus green" pixel. Here the "white" pixel includes a photodiode which received light unimpeded by either the filter or the photoconductor. The "red" pixel includes a photodiode which receives light after passing only through the photoconductor, the latter layer absorbing all but the red light. The "blue plus green" pixel does not include a photodiode. Its MOS element is electrically connected to the photoconductor segment which received light directly. Thus the signal delivered to the MOS represents the blue plus green light intensity falling on the segment of the photoconductor. The "blue" pixel does not include a photodiode. It is connected to a different segment of the photoconductor, one which underlies the magenta filter. That segment filters out the green light and consequently the only light available which the photoconductor segment is sensitive to is blue light.

EXAMPLE 4

This example is the same as Example 3 except that a yellow filter (absorbs blue light) is substituted for the magenta filter. This results in "white," "red," "green," and "blue plus green" pixels.

These examples can be explained with reference to FIG. 2, wherein the columns represent the pixel "colors" under the given circumstances. Note that "white" pixels are not shown. Also pixels 8 and 11 are not tabulated since they will always be the same as 6 and 9 respectively.

| filter 4 | layer 3 | PIXELS | | | |
|---|---|---|---|---|---|
| | | 6 | 9 | 7 | 10 |
| magenta (absorbs green) | CdS (absorbs blue) | R | R + G | B | B |
| cyan (absorbs red) | CdS (absorbs blue) | G | R + G | B | B |
| magenta (absorbs green) | GaAsP (absorbs B + G) | R | R | B | B + G |
| yellow (absorbs blue) | GaAsP (absorbs B + G) | R | R | G | B + G |

The above should be considered exemplary only, other combinations being readily apparent.

Figure 3:
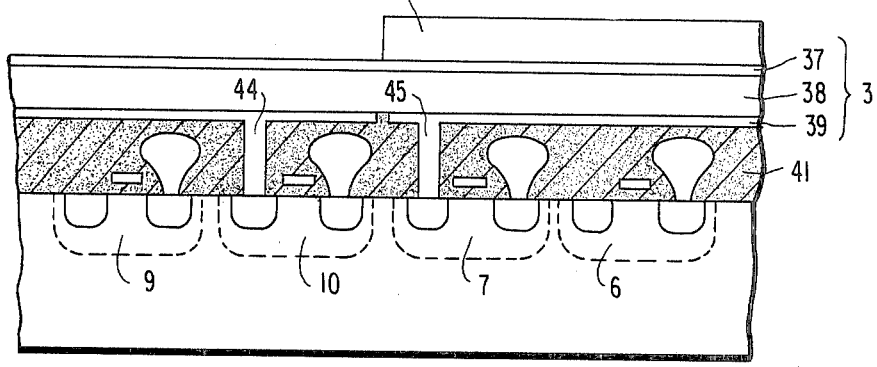
FIG. 3 is a longitudinal cross-sectional view of the solid-state color imager of the present invention.

Referring now to FIG. 3, which is a longitudinal cross-sectional plan view of the imager of the invention, details of the layer 3 can be given. As indicated above, the photosensitive layer 3 is comprised of three sublayers. The layer 3 includes sublayers 37, 38 and 39. The layer 3 is insulated from the base 2 by insulation material layer 41. Accordingly, the layer 3 is insulated electrically from the base 2 at all points other than via the electrical connections 44 and 45.

The photosensitive layer 3 includes a top transparent electrode sublayer 37 and a bottom mosaic transparent electrode sublayer 39. A sublayer 38 of a photoconductive material is positioned between the sublayers 37 and 39. The layer 4 is a mono color light filter stripe or mosaic. The bottom mosaic electrode sublayer 39 must be transparent. The layer 3 and filter 4 is constructed as as to be capable of absorbing different colors of light as described in detail in connection with FIGS. 5–5c. The pixel elements are shown only generally in FIG. 3. Since the MOS elements of pixels 10 and 7 are connected to respective segments of photosensitive layer 3, those pixels will not include photodiodes. Pixels 6 and 9, on the other hand will have photodiodes (not shown) as their photosensing elements.

Figure 4:
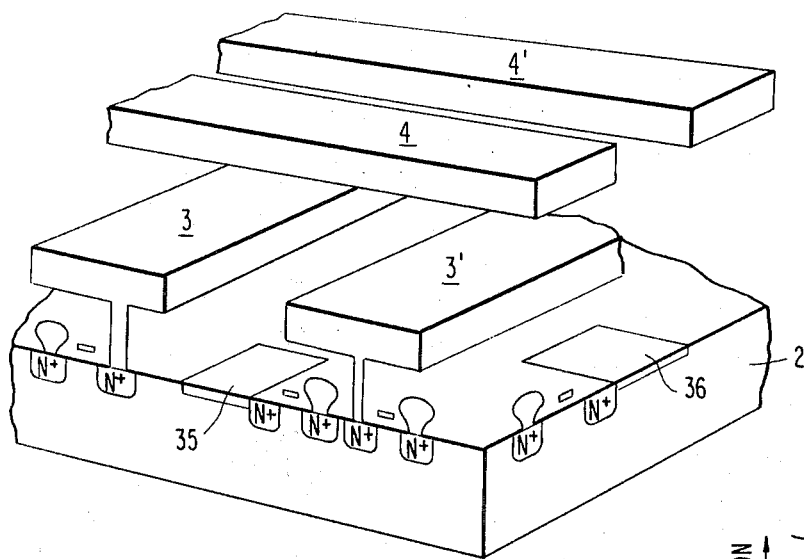
FIG. 4 is a schematic perspective view of another embodiment the solid-state color imager of the present invention.

By producing a device in the manner as shown within FIGS. 2, 3 or 4 it is possible to eliminate the need for an array of integral multi-color filters. More specifically, the present invention does not require the configurations of filter arrays such as as shown in FIG. 1 and are disclosed within U.S. Pat. Nos. 3,971,065 and 4,047,203. Since the device does not require integral (multi-color) color filters on top of the solid-state device, the present invention can be constructed in a relatively simple manner at a relatively low cost.

The present invention can operate without the need for any filters other than the mono color stripe or mosaic filter 4. However, it is possible to utilize a single broad band type filter superimposed over the filter 4. Such a filter can be designed to filter out light not visible to the human eye, such as light having a wavelength of less than 4000 Å or greater than 7700 Å, i.e., ultraviolet or infrared light.

By referring now to FIG. 4, a perspective view of an embodiment of the imager of the present invention can be seen. As shown within FIG. 4, light strikes the top surface of the stripe or mosaic filters 4 and 4'. As described in detail below, some of the light striking the filter is absorbed by the stripe or mosaic filters and the unabsorbed light may strike one of the photosensitive stripes 3 or 3' where additional light is absorbed and the remaining light strikes the base 2. Photodiodes 35 and 36 are positioned on base 2. The various possibilities resulting from the above arrangement have already been described. They are: (1) Light impinges directly onto the photodiode of a pixel without passing through either filter 4 or photoconductor 3. (2) Light impinges on a photodiode of a pixel after passing only through filter 4. (3) Light impinges on a photodiode after passing only through photoconductor 3. (4) Light impinges on a photodiode after passing through filter 4 and photoconductor 3. (5) A MOS element is connected to a photoconductor segment which receives light directly. (6) A MOS element is connected to a photoconductor segment which receives light only after passing through filter 4.

Figure 5:
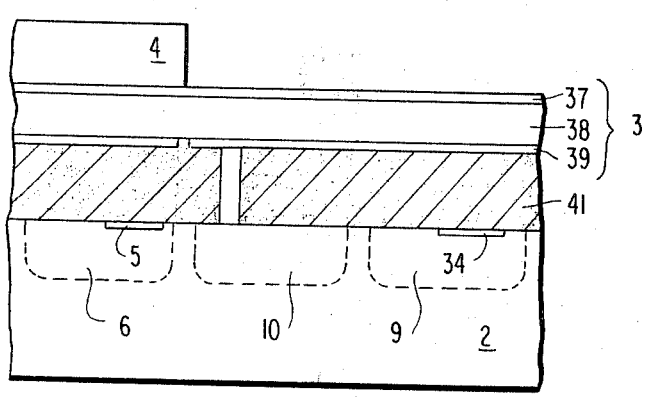
FIGS. 5, 5a, 5b and 5c are, respectively, a longitudinal cross-sectional view of the imager and graphs wherein the absorption versus wave-length has been plotted with respect to the light which is absorbed and sensed within the photosensitive layer, light filtered by the stripe filter and light absorbed and sensed in the first and second sets of photosensor elements of the base layer.
Figure 5A:
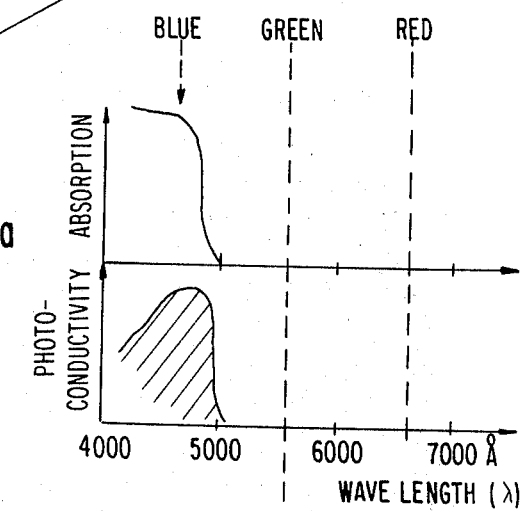
Figure 5B:
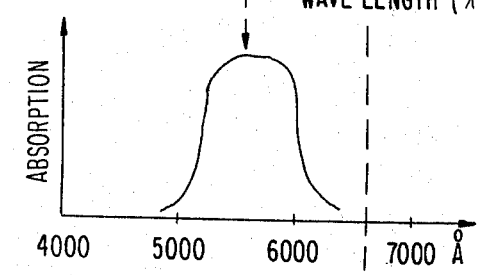
Figure 5C:
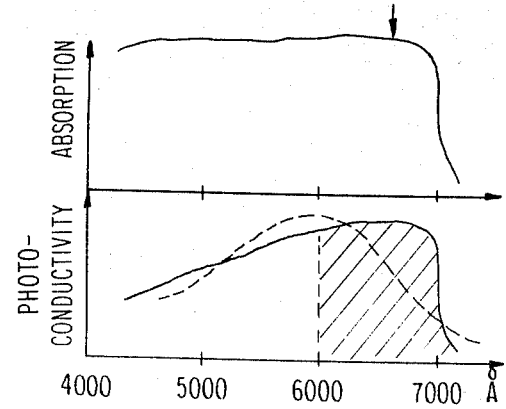

By referring to FIG. 5 in combination with FIGS. 5a–5c, the operation of the imager of the present invention, in one embodiment, can be described in detail. FIG. 5 is a longitudinal cross-sectional view of the device similar to that shown within FIGS. 2 and 3. FIGS. 5c, 5b and 5a are respectively, graphs wherein both absorption and photoconductivity versus wavelength have been plotted with respect to light which is absorbed and sensed within layer 3 as well as light sensed by photosensitive elements 5 and 34 on base 2.

As light in the wavelength region to which the layer 3 is responsive strikes the layer 3, the resistance of the photoconductive sublayer 38, (see FIG. 3) at that particular area (see FIG. 2) is reduced (see FIG. 5a). The decreased resistance can be electrically detected and recorded by the utilization of the electrode sublayers 37 and 39 in connection with the MOS element 10 within the base 2. The particular manner of recording the decrease in electrical resistance which is carried out in connection with the detection of light is not part of the present invention and is well known to those skilled in the art. The decreased resistance represents the intensity of blue light falling on one area of the layer 3. (See FIG. 5a.) Furthermore, as shown by the absorption curve of FIG. 5a, the layer 3 absorbs light only in the blue region. Light which passes through the layer 3 only contains the green and red portions of the spectrum. The layer 3 absorbs all light having a wavelength of 5000 Å or less and allows the remainder of the light to pass through to the base 2. Furthermore, the layer 3 is sensitive to light having a wavelength of 5000 Å or less. As shown by the absorption curve for the filter 4 (see FIG. 5b), it absorbs light in only the green region.

As shown within FIG. 5c, the photosensitive elements 5 and 34 of the base 2 absorb all visible light and are somewhat sensitive to all visible light. However, elements 5 are most sensitive to light in the red portion of the spectrum (see solid line) and elements 34 are most sensitive to light in the green region of the spectrum. As explained above, the layer 3 senses and filters out the blue light. Therefore, no blue light strikes the base 2. The filter 4 filters out the green light. Accordingly, only red light falls on the area of the base 2 beneath the filter 4, thus striking element 5 and only green and red light will strike the elements 34 which are not covered by the stripe filter 4. As the red light stikes element 5 and/or red and green light strike the element 34, the current is varied in a manner allowing for the detection of the light by means of electrical impulses.

By utilizing the layer 3 and filter stripes 4 and elements 5 and 34, having the particular abilities of absorption and photoconductivity as explained above, it is possible to accurately perceive light striking any particular region of the imager and to determine the wavelength and thus color of the light striking that region. The layer 3 can detect blue light at any particular area. The elements 5, which are shielded by layer 3 and filter 4 are only exposed to and thus detect red light. The elements 34 are exposed to red and green light. Accordingly, the presence of green light must be determined by electronic substractive methods by utilizing data obtained from adjacent elements 5. These methods are known to those skilled in the art and are not part of this invention. The intensity of the light striking any area of a layer or any photosensitive element can also be determined by the degree of change in resistance. The layer 3 and elements on the base 2 are constructed so that small variations in resistance can be determined so that the relative intensity of the light of any particular wavelength (color) striking the imager can be detected and recorded via electronic means in connection with the base 2.

It is possible to construct the color imager disclosed herein in a variety of different embodiments. Although construction details are not shown, it will be apparent that the imager array can be constructed in the manner as shown within the above-referred British patent, with the variations necessary to accommodate photosensitive elements such as elements 5, 5' and 34, 34' on the base 2.

The embodiment shown within FIG. 5, and explained in connection with FIGS. 5a–5c is considered to be the preferred embodiment of the invention. The upper filter absorbs green light, the layer 3 detects and absorbs at least blue light, and the elements 5 and 34 detect at least red light. By constructing the layer 3 such that it is capable of detecting and absorbing light, it acts as both a sensor and a filter. By using the filter stripes 4 and layer 3, arranged in the correct manner, the need for the multi-color filters which must be arranged in an integral array has been eliminated, while the ability of the device to detect different colors of light has been maintained.

The device as shown within FIG. 5 and described in connection with FIGS. 5a–5c can be constructed in different manners in order to obtain different end results. However, the embodiment as shown and described in connection with FIG. 3, as well as the embodiment of FIG. 4 has been found to give desirable results. When constructing a device which is intended to operate in this manner, the insulating materials within the insulative layer as well as the material within each of the photosensitive layer must be constructed in a particular manner.

The insulative materials within layers 41 and 42 may be comprised of a number of electrically insulative materials such as $SiO_2$, $Si_3N_4$, polyimide, polyamide, photoresist or other known organic polymers.

A photosensitive layer 3 sensitive to blue light may be comprised of a material selected from the group consisting of CdS, ZnCdS or ZnSeTe.

Depending upon the particular type of photosensitive layers and elements which are utilized, and the use to which the device is to be put, different amounts of voltage can be used in the operation of the device. Furthermore, different voltages can be utilized in connection with the photosensitive layer and/or elements depending upon the particular results desired.

The present solid-state color imager has been disclosed and described herein in what is considered to be the most practical and preferred embodiments. The reference to particular materials, particular terminologies, and the particular sensitivities of the photosensitive layer and photodiodes to particular wavelengths and colors of light is done merely to disclose preferred embodiments. It is recognized, however, that departures may be made therefrom which are within the scope of the invention and that modifications will occur to one skilled in the art upon reading the description.

What is claimed is:
1. A solid-state color imager, comprising:
a semiconductor switching matrix comprising a matrix of charge switching elements and a group of photodiodes, each photodiode being associated with one charge switching element, respectively, a first group of said charge switching elements being unassociated with any photodiodes, each said charge switching element alone or with an associated photodiode comprising a pixel of said semiconductor switching matrix;
a plurality of photoconductor segments overlying at least a portion of said semiconductor switching matrix, said segments being electrically connected respectively to charge switching elements unassociated with photodiodes, whereby the intensity of light sensed by any said segment is transferred to the electrically connected charge switching ele- ment as an electrical signal representing light intensity;

a mono color filter overlying a portion of said photoconductor segments and a portion of said semiconductor switching matrix;

said mono color filter, said photoconductor segments and said switching matrix being positioned relative to one another so that said pixels with photodiodes receive and convert into electrical signals light which impinges thereon after passing through one, both or neither of said filter and photoconductor segments, and said pixels without photodiodes receive electrical signals from photoconductor segments which convert light impinging thereon directly or via said filter.

2. A solid-state color imager, as claimed in claim 1, wherein said mono color filter absorbs light in the green region of the spectrum, said photoconductor segments are sensitive to and absorb light in only the blue region of the spectrum, and said photodiodes of said base are sensitive to light at least in the red and green regions of the spectrum.

3. A solid-state color imager, as claimed in claim 1, wherein said mono color filter absorbs light in the red region of the spectrum, said photoconductor segments are sensitive to and absorb light in only the blue region of the spectrum, and said photodiodes of said base are sensitive to light at least in the red and green regions of the spectrum.

4. A solid-state color imager, as claimed in claim 1, wherein said mono color filter absorbs light in the green region of the spectrum, said photoconductor segments are sensitive to and absorb light in only the blue or green region of the spectrum, and said photodiodes of said base are sensitive to light at least in the red regions of the spectrum.

5. A solid-state color imager, as claimed in claim 1, wherein said mono color filter absorbs light in the blue region of the spectrum, said photoconductor segments are sensitive to and absorb light in only the blue or green region of the spectrum, and said photodiodes of said base are sensitive to light at least in the red regions of the spectrum.

6. A solid-state color imager, as claimed in any of claims 1, 2, 3, 4 or 5, wherein said photoconductor segments form a continuous sheet.

7. A solid-state color imager, as claimed in any of claims 1, 2, 3, 4 or 5, wherein said photoconductor segments are in the form of a plurality of stripes.

8. A solid-state color imager, as claimed in any of claims 1, 2, 3, 4 or 5, wherein said charge switching elements arranged on said base are metal oxide semiconductor devices.

9. A solid-state color imager, as claimed in claim 1, wherein said photoconductor segments are comprised of a photosensitive material selected from the group consisting of amorphous selenium, CdSe or GaAsP.

* * * * *